United States Patent [19]

Laakso et al.

[11] 3,873,505

[45] Mar. 25, 1975

[54] NOVEL LIGHT-SENSITIVE COPOLYESTERS

[75] Inventors: Thomas M. Laakso, Rochester, N.Y.; Harold L. Van Nice, Pullman, Wash.

[73] Assignee: Eastman Kodak Company, Rochester, N.Y.

[22] Filed: Nov. 16, 1973

[21] Appl. No.: 416,724

Related U.S. Application Data

[63] Continuation of Ser. No. 247,069, April 24, 1972, abandoned, which is a continuation-in-part of Ser. No. 19,064, March 12, 1970, abandoned.

[30] Foreign Application Priority Data

Apr. 23, 1969 France ............................ 69.12829

[52] U.S. Cl. ............ 260/75 UA, 96/115 R, 117/49, 117/71 R, 117/76 P, 117/124 E, 117/132 C, 117/138.8 F, 117/138.8 N, 117/138.8 PV, 117/143 A, 117/145, 117/15.5 R, 117/161 K, 260/30.8 DS, 260/31.2 XA, 260/31.4 R, 260/32.6 R, 260/32.8 R, 260/33.8 R

[51] Int. Cl. ............................................ C08g 17/10

[58] Field of Search ................................ 260/75 UA

[56] References Cited

UNITED STATES PATENTS

| | | | |
|---|---|---|---|
| 2,683,100 | 7/1954 | Edgar et al. | 117/232 |
| 2,744,091 | 5/1956 | Caldwell | 260/75 |
| 2,744,094 | 5/1956 | Caldwell | 260/75 |
| 2,956,878 | 10/1960 | Michiels | 96/33 |
| 3,556,791 | 1/1971 | Suzuki et al. | 96/35.1 |
| 3,677,754 | 7/1972 | Ford et al. | 96/35.1 |

*Primary Examiner*—Melvin Goldstein
*Attorney, Agent, or Firm*—A. H. Rosenstein

[57] ABSTRACT

There is described a novel group of light-sensitive copolyesters prepared by condensing at least one alkylene glycol of 2 to 12 carbon atoms with a mixture of bis-esters of dicarboxylic acids, from 30 to 70 mole percent of the bis-esters being the bis-ester of non-light-sensitive aromatic dicarboyxlic acid selected from terephthalic acid and isophthalic acid and from 70 to 30 mole percent of the bis-esters being a light-sensitive bis-ester having the formula:

```
ROOC-C-COOR
     ‖
     CH
     |
     CH
     ‖
     R1
```

where R is a lower alkyl group of 1 to 4 carbon atoms and $R_1$ is an alkylidene, aralkylidene or heterocyclic group.

8 Claims, No Drawings

NOVEL LIGHT-SENSITIVE COPOLYESTERS

This is a continuation of application Ser. No. 247,069, filed 4/24/72 which in turn was a continuation-in-part of application Ser. No. 19.064 filed Mar. 12, 1970 both now abandoned.

This invention relates to novel light-sensitive polyesters.

It is well known that certain polymers, which initially are soluble in organic solvents, become insoluble in the same solvents after exposure to an appropriate light source. Thus, if one of these polymers is coated on a support and is imagewise exposed to actinic radiation, the exposed areas become insoluble and the unexposed areas, which have remained soluble, can then be removed by treatment with an appropriate solvent. A polymeric image is obtained on the support, and can be used in photomechanical reproduction processes.

A particular group of light-sensitive polymers which can be utilized in this way comprise those having residual unsaturation which is capable of causing crosslinking of the polymer upon exposure to actinic radiation. In U.S. Pat. No. 2,956,878 and French Pat. No. 1,137,056, a group of light-sensitive polyesters are described which are prepared from (2-propenylidene)-malonic compounds such as cinnamylidenemalonic acid, and dihydroxy compounds, e.g., diols or phenols. The homopolymers obtained by the procedure of these patents are light-sensitive and have properties which make them useful in photoengraving and lithography. These polymers are hard, transparent resins which are initially insoluble in water and soluble in organic solvents (e.g., ketones, chlorinated hydrocarbons, aromatic hydrocarbons, ethers, etc.), but after having been exposed to actinic radiation they become insoluble in the aforesaid organic solvents. Moreover, they are insoluble in the acid baths used in photoengraving, e.g., ferric chloride, nitric acid, etc. Furthermore, these homopolymers are oleophilic and display a good affinity for lithographic inks.

As indicated above, after imagewise exposure of a layer of a light-sensitive polymer, such as described in the afore-cited patents, an image can be developed by removing the unexposed areas with a solvent which, advantageously, is a chlorinated solvent such as trichloroethylene. This solvent development operation must leave intact the exposed areas, which constitute a negative image of the original. This requires that the polymer have appropriate mechanical properties after the photochemical crosslinking. In particular, it is essential that the lightsensitive polymer layers that are used to prepare resists and lithographic printing plates by a solvent development process be neither sticky nor tacky, but that they display good adherence to metal surfaces on which they are coated. Moreover, for the preparation of resists these polymer layers must be inert to highly acidic etching baths, which are frequently used in photomechanical reproduction processes.

However, it has been found with polymers of the type described in the above-mentioned U.S. Pat. No. 2,956,878 that the solvents used for development, not only selectively remove the unexposed areas, but also penetrate into the exposed areas of the light-sensitive layer, causing the exposed areas to swell and thereby rendering them very fragile and reducing their adhesion to substrates on which they are coated. During drying, the fine details in the swollen areas may not resume the exact shape that they had initially, which affects the definition of the final image.

It is apparent, therefore, that by increasing the resistance of this type of polyester to swelling in developing solvents, such as trichloroethylene, one is able to improve the definition and the exposure latitude of the photosensitive elements which use them. Moreover, if the procedure used to improve the swelling resistance of the polymer also permits variations in other physical properties, polymers can be tailor made for use in different processes.

Accordingly, it is an object of this invention to prepare novel light-sensitive polymers which have improved physical properties useful in photomechanical and related reproduction processes.

It is a further object of this invention to prepare novel light-sensitive polymers, the physical properties of which can be readily modified to make them useful in a variety of photographic reproduction processes.

It is yet a further object of this invention to provide novel light-sensitive polymers which can be prepared by processes which permit production of a polymer having selected physical properties.

These and other objects of this invention are accomplished by a novel class of copolyesters prepared by condensing at least one alkylene glycol with the bis-ester of a (2-propenylidene)malonic acid and the bis-ester of a non-light-sensitive aromatic dicarboxylic acid.

The light-sensitive copolyesters of this invention are readily prepared by conventional polycondensation procedures utilizing relatively inexpensive, readily available starting materials. These copolyesters are stable over long periods of time and lend themselves to most common reproduction processes because of their mechanical and chemical properties. These properties can be varied from a soft rubbery to a hard glassy amorphous copolyester, and even crystalline copolyesters can be prepared. Copolyesters of this invention can be prepared which are non-tacky when coated from solution on a suitable base and which give hard smooth coatings that are resistant to swelling in the common developer solvents, that have good adhesion to substrates on which they are coated and that they withstand the action of highly acidic etching baths.

In particular, copolyesters of this invention comprise the condensation product of at least one alkylene glycol of 2 to 12 carbon atoms with a mixture of bis-esters of dicarboxylic acids, from 30 to 70 mole percent of the bis-esters being the bis-ester of a non-light-sensitive aromatic dicarboxylic acid selected from terephthalic acid and isophthalic acid and from 70 to 30 mole percent of the bis-esters being a light-sensitive bis-ester which can be represented by the formula:

```
ROOC-C-COOR
     ‖
     CH
     |
     CH
     ‖
     R1
```

wherein R is a lower alkyl group of 1 to 4 carbon atoms, e.g., methyl, ethyl, n-propyl, isopropyl, n-butyl, sec-butyl, and t-butyl, preferably R is a methyl group; and $R_1$ is an alkylidene, aralkylidene or heterocyclic group which is free of functional substituents, (i.e., free of substituents which can interfere with a polyesterification reaction), for example, $R_1$ can be an ethylidene, benzylidene, o-nitrobenzylidene, naphthylmethylene, furfurylidene, pyridylidene, quinolylidene, benzothiazolylidene, or the like group; preferably $R_1$ is a benzylidene group.

Examples of light-sensitive dicarboxylic acids, the bis-esters of which are useful in the present invention, include cinnamylidenemalonic acid, crotylidenemalonic acid, γ-methyl-crotylidenemalonic acid, o-nitrocinnamylidenemalonic acid, naphthylallylidenemalonic acid, 2-furfurylidenemalonic acid, N-methylpyridylidene-2-ethylidenemalonic acid, N-methylquinolylidene-2-ethylidenemalonic acid, N-methylbenzothiazolylidene-2-ethylidene-malonic acid, and the like.

Suitable alkylene glycols can be represented by the formula:

$$HO—R_2—OH \quad \text{(II)}$$

where $R_2$ represents an alkylene group having 2 to 12 carbon atoms, e.g., an ethylene, propylene, butylene, amylene, hexylene, decylene, dodecylene, or the like group, including cycloalkylene group such as a cyclohexylene, ethoxycyclohexylene, or the like group; preferably $R_2$ is a lower alkylene group having 2 to 5 carbon atoms. Examples of suitable alkylene glycols include ethylene glycol, diethylene glycol, triethylene glycol, 1,3-propanediol, 1,2-propanediol, 1,4-butanediol, 2,3-butanediol, 1,5-pentanediol, 2,2-dimethyl-1,3-propanediol, cyclohexane-dimethanol, decamethylene glycol, dodecamethylene glycol, and the like.

In a preferred embodiment more than one dihydroxy compound is employed to prepare the copolyester; that is, a mixture of diols as well as diesters is employed.

Suitable bis-esters of non-light-sensitive aromatic dicarboxylic acids can be represented by the formula:

$$ROOC—R_3—COOR \quad \text{(III)}$$

where R is as defined above and $R_3$ is an m- or p-phenylene group. As examples of preferred non-light-sensitive aromatic dicarboxylic acids, there can be mentioned terephthalic acid, isophthalic acid, and the like.

The light-sensitive copolyesters of this invention can be represented as being composed of the following repeating units:

IV

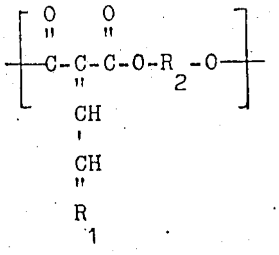

, and

V

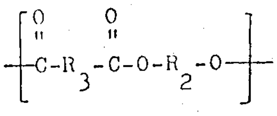

wherein $R_1$, $R_2$ and $R_3$ are as defined above; the IV units representing about 30 to 70 percent of the repeating units in the polymer backbone and the V units representing about 70 to 30 percent of the repeating units. The preferred polymers of this invention have an inherent viscosity greater than about 0.3 and preferably between about 0.7 and 1.0, measured at a concentration of 0.25 gram per deciliter in a 1:1 mixture of phenol:-chlorobenzene at 25°C.

The copolyesters of this invention can be prepared by conventional polyesterification or ester interchange procedures using techniques well known to those skilled in the art. Suitable esterification catalysts include titanium esters, such as titanium isopropoxide, and butyl titanate, as well as strontium oxide, zinc acetate, antimony oxide and similar catalysts generally used for the preparation of polyesters. Typically a two-stage reaction is employed. The first stage is allowed to proceed at reflux for a period sufficient to complete the initial formation of the prepolymer. Usually periods of about several minutes to several hours, e.g., 30 minutes to 4 hours are sufficient for this first-stage reaction. The second stage reaction is conducted for a period of time at elevated temperatures and reduced pressure sufficient to build up to the desired molecular weight of the polymer and to remove reaction by-products and unused reactants.

We have found that in order to obtain soluble copolyesters of this invention having relatively high inherent viscosities and to permit reproducibility of the physical properties of the copolyesters without the need for critical controls, it is useful to employ monomers having a relatively high degree of purity. The monomers, and in particular the light-sensitive bis-esters, should be purified by fractional distillation, fractional crystallization, or similar techniques so that the monomer is at least 99 percent pure. If sufficiently pure monomers are not employed, it has been found that soluble copolyesters of high molecular weight cannot be prepared consistently. Thus, the preferred copolyesters of this invention are prepared with a light-sensitive bis-ester of the above-indicated purity.

The preferred copolyesters are prepared from light-sensitive bis-esters whose purity has been monitored by gas phase chromatography. Preferably, a gas chromatogram of the light-sensitive bis-ester obtained from a gas chromatograph having a flame ionization detector and a ¼ inch diameter column, 6 feet long, packed with 2.3 percent dimethylsilicon gum rubber on 80 to 100 mesh white diatomaceous earth, operating at a program temperature range of 100°–290°C. and a program rate of 20°C. per minute using helium as a carrier gas, has a major peak which is at least 99 area percent of all the peaks on the chromatogram.

Coating compositions containing the light-sensitive copolyesters of this invention can be prepared by dispersing or dissolving the polyester in any suitable solvent or combination of solvents used in the art to prepare polymer dopes. Solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as dimethylformamide and dimethylsulfoxide; and mixtures of these solvents. Typically the light-sensitive copolyester is employed in the coating composition in the range from about 1 to 20 percent by weight. Preferably the copolyester comprises 2 to 10 percent by weight of the composition in a solvent such as listed above. The coating compositions also can include a variety of photograhic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

Although the copolyesters of this invention are useful without additional sensitization, it is possible to increase their photosensitivity by adding suitable sensitizers to the photosensitive layer. Suitable compounds that can be used as sensitiziers include 2-(benzoylmethylene)-1-methyl-β-naphthothiazoline, 2-benzoylcarbethoxymethylene-1-methyl-β-naphthothiazoline, 1-carbethoxy-2-keto-3-methyl-2-azabenzanthrone, eosin, etc. Other sensitizers are described, for example, in French Pat. No. 1,086,257 of Jan. 19, 1952, French Pat. No. 1,089,290 of Oct. 14, 1953, U.S. Pat. No. 2,610,120 (nitro compounds), U.S. Pat. No. 2,690,966 (triphenylmethanes), U.S. Pat. No. 2,670,285 (anthrones), U.S. Pat. No. 2,670,287 (diaminobenzophenone imide, -diphenylmethanes, -diphenyl ketones, -diphenylcarbinols), U.S. Pat. No. 2,670,286 (quinones), and U.S. Pat. No. 2,732,301, (thiazoles, thiazolines, cyanine dyes, etc.). Also, it has been found that photosensitive products of especially high speeds are obtained when methyl 2-(N-methylbenzothiazolylidene)dithioacetate is used as the sensitizer.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals a schromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive copolyester employed, and the nature of other components which may be present in the coating. Typical coating thicknesses can be from about 0.1 to 20 mils.

Photomechanical images can be prepared with photosensitive elements by imagewise exposing the element to a light source to harden or insolubilize the copolyester in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked copolyester which is a nonsolvent for the exposed hardened copolyers. Such solvents can be selected from the solvents listed above as suitable coating solvents as well as others.

The following examples further illustrate this invention.

EXAMPLE 1 PREPARATION OF DIETHYL CINNAMYLIDENEMALONATE

Nineteen hundred eighty grams (15 moles) of cinnamaldehyde, twenty four hundred grams (15 moles) of diethyl malonate, 3 liters of methylene chloride and 20 ml piperidine are stirred and refluxed under an azeotropic stillhead for 26 hours. At the end of this time water no longer is separated by refluxing. Most of the methylene chloride is stripped off at reduced pressure. The residual oil is then heated to 95°C. at 15 mm pressure to remove any low-boiling materials. The resulting light-amber colored oil is distilled at about 15 microns pressure from a stirred pot still and the main cut boiling at 130°–132°/14 microns is taken as good material. Refractive index 1.5992/25°C. Yield is 66 percent of theory based on the quantity of the starting materials. A gas chromatogram of this bis-ester has a major peak, the area of which is greater than 99 area percent of all the peaks on the chromatogram.

EXAMPLE 2 PREPARATION OF DIMETHYL CINNAMYLIDENEMALONATE

Ninety-nine grams (0.75 mole) of cinnamaldehyde, 99 grams (0.75 mole) of dimethyl malonate, 150 ml of dry benzene, 100 grams of an adsorbent, (Linde Molecular Sieve 4A), 3 grams of piperidine, 4 grams of cinnamic acid and 3 grams of quinoline are stirred overnight in a three-necked 500 ml flask protected from moisture. Gas chromatographic analysis shows the reaction to be complete after 18 hours. After all the benzene and quinoline, etc., are removed by distillation at reduced pressure, 171 grams of a sticky brown crystalline solid remain. This solid is dissolved in 600 ml of methyl alcohol and the solution is chilled to −20°C. About 100 grams of a light yellow crystalline product, m.p. 66°–67°C. are obtained. This represents a 54 percent yield based on the quantity of starting materials. A gas chromatogram of this bis-ester has a major peak, the area of which is greater than 99 area percent of all the peaks on the chromatogram.

EXAMPLE 3 PREPARATION OF COPOLYESTER

Forty six and one half grams (0.75 mole) of dry, distilled ethylene glycol, 20.25 grams (0.105 mole) of dimethyl terephthalate and 53.4 grams (0.195 mole) of diethyl cinnamylidenemalonate prepared in Example 1 are weighed into a clean, dry 125 milliliter side arm flask. The side arm of the flask is fitted with a cork and the flask itself fitted with a glass tube reaching into the material in the flask so that the slow stream of nitrogen provides an inert cover and agitates the reaction mixture during the first stage of the heating. The flask is also fitted with an efficient Vigreux column for refluxing high-boiling reagents during the first heating stage, but allowing the generated alcohols to distill off. All reactants are melted by inserting the flask in a silicone oil bath held at 235°C. in subdued light. Four drops of titanium isopropoxide are added to the homogeneous melt and the flask and contents are heated at a reflux for three hours. After this time the Vigreux column, inert gas tube and the cork are removed and the side arm connected to a vacuum pump through two dry-ice traps. A stainless steel stirrer, fitted with a ball joint, is inserted into the reaction melt to stir the polymer as the pressure is lowered to 0.08 mm Hg. The polymer is stirred at this pressure for a total of 45 minutes. A dark amber, viscous melt is obtained which on cooling hardens to a hard amorphous glass having an inherent viscosity of 0.78 in 1:1 phenol:chlorobenzene solution at a concentration of 0.25 gm/deciliter of solution and a temperature of 25°C.

EXAMPLES 4-13 PREPARATION OF COPOLYESTERS

Using the procedure of Example 3, copolyesters are prepared from the below listed reactants. The first stage reaction time is the length of time the reactants are heated at reflux and the second stage reaction time is the length of time the reactants are heated under reduced pressure. The inherent viscosities are measured using the solvents and under the conditions of Example 3.

Example 4

| | | |
|---|---|---|
| 37.4 g | 15 Mole Percent | 1,4-Butanediol |
| 181.1 g | 85 Mole Percent | Ethylene glycol |
| 135.8 g | 35 Mole Percent | Dimethyl terephthalate |
| 356.2 g | 65 Mole Percent | Diethyl cinnamylidenemalonate |
| 0.1 cc | | Titanium isopropoxide |
| | First stage | 3 hours |
| | Second stage | 90 minutes |
| | Inherent viscosity of polymer | 0.84 |

Example 5

| | | |
|---|---|---|
| 45 g | 100 Mole Percent | 1,4-Butanediol |
| 47.95 g | 70 Mole Percent | Diethyl cinnamylidenemalonate |
| 14.55 g | 30 Mole Percent | Dimethyl isophthalate |
| 2 drops | | Titanium isopropoxide |
| | First stage | 3 hours |
| | Second stage | 55 minutes |
| | Inherent viscosity of polymer | 0.54 |

Example 6

| | | |
|---|---|---|
| 42.6 g | 50 Mole Percent | Ethylene glycol |
| 62.0 g | 50 Mole Percent | 1,4-Butanediol |
| 54.4 g | 35 Mole Percent | Dimethyl isophthalate |
| 142.4 g | 65 Mole Percent | Diethyl cinnamylidenemalonate |
| 8 drops | | Titanium isopropoxide |
| | First stage | 2 hours |
| | Second stage | 35 minutes |
| | Inherent viscosity of polymer | 0.52 |

Example 7

| | | |
|---|---|---|
| 32.8 g | 50 Mole Percent | Ethylene glycol |
| 46.4 g | 50 Mole Percent | 1,4-Butanediol |
| 40.7 g | 35 Mole Percent | Dimethyl terephthalate |
| 96.0 g | 65 Mole Percent | Diethyl cinnamylidenemalonate |
| 6 drops | | Titanium isopropoxide |
| | First stage | 4.0 hours |
| | Second stage | 25 minutes |
| | Inherent viscosity of polymer | 1.2 |

Example 8

| | | |
|---|---|---|
| 42.6 g | 50 Mole Percent | Ethylene glycol |
| 62.0 g | 50 Mole Percent | 1,4-Butanediol |

Example 8-Continued

| | | |
|---|---|---|
| 54.4 g | 35 Mole Percent | Dimethyl terephthalate |
| 142.4 g | 65 Mole Percent | Diethyl cinnamylidenemalonate |
| 6 drops | | Titanium isopropoxide |
| | First stage | 2.5 hours |
| | Second stage | 25 minutes |
| | Inherent viscosity of polymer | 0.36 |

Example 9

| | | |
|---|---|---|
| 16.2 g | 92.5 Mole Percent | Ethylene glycol |
| 2.2 g | 7.5 Mole Percent | 1,5-Pentanediol |
| 10.9 g | 35 Mole Percent | Dimethyl terephthalate |
| 28.5 g | 65 Mole Percent | Diethyl cinnamylidenemalonate |
| 2 drops | | Titanium isopropoxide |
| | First stage | 5 hours |
| | Second stage | 15 minutes |
| | Inherent viscosity of polymer | 0.75 |

Example 10

| | | |
|---|---|---|
| 16.2 g | 95 Mole Percent | Ethylene glycol |
| 2.2 g | 5 Mole Percent | 1,9-Nonanediol |
| 10.9 g | 35 Mole Percent | Dimethyl terephthalate |
| 28.5 g | 65 Mole Percent | Diethyl cinnamylidenemalonate |
| 2 drops | | Titanium isopropoxide |
| | First stage | 5 hours |
| | Second stage | 25 minutes |
| | Inherent viscosity of polymer | 0.82 |

Example 11

| | | |
|---|---|---|
| 16.2 g | 95 Mole Percent | Ethylene glycol |
| 2.5 g | 5 Mole Percent | 1,10-Decanediol |
| 10.9 g | 35 Mole Percent | Dimethyl terephthalate |
| 28.5 g | 65 Mole Percent | Diethyl cinnamylidenemalonate |
| 2 drops | | Titanium isopropoxide |
| | First stage | 5 hours |
| | Second stage | 15 minutes |
| | Inherent viscosity of polymer | 0.63 |

Example 12

| | | |
|---|---|---|
| 16.2 g | 95 Mole Percent | Ethylene glycol |
| 1.5 g | 5 Mole Percent | Neopentyl glycol |
| 10.9 g | 35 Mole Percent | Dimethyl terephthalate |
| 28.5 g | 65 Mole Percent | Diethyl cinnamylidenemalonate |
| 2 drops | | Titanium isopropoxide |
| | First stage | 5 hours |
| | Second stage | 30 minutes |
| | Inherent viscosity of polymer | 0.69 |

Example 13

| | | |
|---|---|---|
| 82.5 g | 95 Mole Percent | Ethylene glycol |
| 6.3 g | 5 Mole Percent | 1,4-Butanediol |
| 67.9 g | 35 Mole Percent | Dimethyl terephthalate |
| 178.1 g | 65 Mole Percent | Dimethyl cinnamylidenemalonate |
| 4 drops | | Titanium isopropoxide |
| | First stage | 3 hours |
| | Second stage | 1 hour |
| | Inherent viscosity of polymer | 0.53 |

EXAMPLE 14 PHOTOSENSITIVE ELEMENTS

A 5 percent solution in 2-methoxyethyl acetate of the light-sensitive polymer prepared in Example 3 containing as a sensitizer 0.1 percent methyl 2-(N-methylbenzothiazolylidene)-dithioacetate is whirl coated on a plate of 20-mil gravure copper which has been treated previously with 5 percent hydrochloric acid, water, and air dried. The coated plate is dried at 50°C. in an air oven. The resulting photosensitive element is imagewise exposed to a mercury vapor lamp to harden the coating in exposed areas. An image is developed by swabbing the plate with trichloroethane after which the plate is air dried. There is obtained a resist image having good adhesion to the support, little tendency to swell and good resistance to acidic etchants.

EXAMPLE 15 - COMPARISON OF COPOLYESTER AND HOMOPOLYESTER.

Coating compositions are prepared from a copolyester of Example 13 having an inherent viscosity of 0.77 and a homopolyester of Example 4 of U.S. Pat. No. 2,956,878 (tetramethyl cinnamylidenemalonate) having an inherent viscosity of 0.81. The compositions have the general formulation:

| | |
|---|---|
| light-sensitive polymer | 7.5 g |
| 2,6-bis-p-ethoxyphenyl-4-p-N-amyloxyphenyl-thiapyrylium perchlorate sensitizer | 0.15 g |
| monochlorobenzene | 30 cc |
| cyclohexanone | 3.75 cc |
| 4-butyrolactone | 3.75 cc |

The clear formulations are gravity filtered, whirl coated on brush pumiced gravure copper plates to give coating thicknesses in the range of 0.14 to 0.21 mil, dried at room temperature, and prebaked at 80°C for 20 minutes. The coatings are then exposed for four minutes to a 95-amp carbon arc through a transparency containing a step tablet and a negative line image pattent, after which they are developed by placing them for 15 seconds in a trichloroethylene vapor degreaser in which they are subjected to both direct spraying with trichloroethylene and contact with trichloroethylene mist. After 3 to 4 seconds in the vapor degreaser, the homopolyester coating in fully exposed areas begins to slough off the copper plate. After removal from the vapor degreaser the homopolyester coating remains on the copper plate only in partially exposed areas, (those areas exposed through steps on the step tablet having a density of 1.10 to 2.31) and in these areas the coating is quite swollen. In fully exposed areas, the coating has sloughed off the plate, indicating poor adhesion to the substrate, while in unexposed areas the coating is removed but a thin layer of scum is left on the plate. The copolyester coating is cleanly developed with no sloughing off of the fully exposed areas, little or no swelling and no background scum.

The invention has been described in detail with particular reference to preferred embodiments thereof, but it will be understood that variations and modifications can be effected within the spirit and scope of the invention.

What is claimed is:

1. A light-sensitive copolyester consisting of the condensation product of at least one alkylene glycol of 2 to 12 carbon atoms with a mixture of bis-esters of two dicarboxylic acids, from 30 to 70 mole percent of the bis-esters being the bis-ester of a non-light-sensitive aromatic dicarboxylic acid selected from the group consisting of terephthalic acid and isophthalic acid and, correspondingly, from 70 to 30 mole percent of the bis-esters being a light-sensitive bis-ester having the formula:

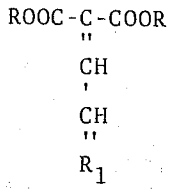

wherein R is a lower alkyl group of 1 to 4 carbon atoms and $R_1$ is ethylidene, benzylidene, o-nitrobenzylidene, naphthylmethylene, furfurylidene, pyridylidene, quinolylidene, or benzothiazolylidene.

2. A light-sensitive copolyester of claim 1 wherein the alkylene glycol is a mixture of two alkylene glycols of 2 to 5 carbon atoms.

3. A light-sensitive copolyester of claim 1 wherein the light-sensitive bis-ester is a bis-alkyl ester of cinnamylidenemalonic acid.

4. A light-sensitive copolyester according to claim 1 having an inherent viscosity greater than about 0.3.

5. A light-sensitive copolyester according to claim 1 having an inherent viscosity between 0.7 and 1.0.

6. A light-sensitive copolyester consisting of the condensation product of a mixture of 1,4-butanediol and ethylene glycol with a mixture of bis-esters of two dicarboxylic acids consisting of from 30 to 70 mole percent of dimethyl terephthalate and, correspondingly, from 70 to 30 mole percent of dimethyl cinnamylidenemalonate.

7. A light-sensitive copolyester consisting of the condensation product of a mixture of 1,4-butanediol and ethylene glycol with a mixture of bis-esters of two dicarboxylic acids consisting of from 30 to 70 mole percent of dimethyl isophthalate and, correspondingly, from 70 to 30 mole percent of dimethyl cinnamylidenemalonate.

8. A light-sensitive copolyester which consists of from 30 to 70 mole percent of repeating units of the formula:

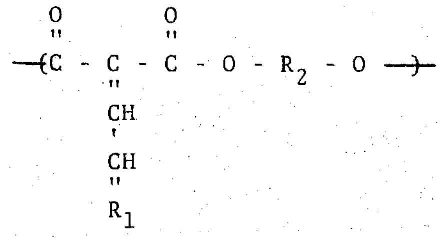

and, correspondingly, from 70 to 30 mole percent of units of the formula:

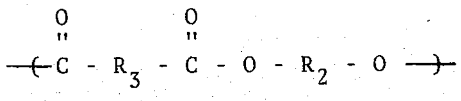

wherein $R_1$ is ethylidene, benzylidene, o-nitrobenzylidene, naphthylmethylene, furfurylidene, pyridylidene, quinolylidene, or benzothiazolylidene; $R_2$ is an alkylene group of 2 to 12 carbon atoms and $R_3$ is an m- or p-phenylene group.

* * * * *

UNITED STATES PATENT AND TRADEMARK OFFICE

CERTIFICATE OF CORRECTION

PATENT NO. : 3,873,505

DATED : March 25, 1975

INVENTOR(S) : Thomas M. Laakso, Harold L. Van Nice

It is certified that error appears in the above-identified patent and that said Letters Patent are hereby corrected as shown below:

Column 2, lines 56-64, the formula should read as follows:

```
I          ROOC-C-COOR
                ‖
                CH
                |
                CH
                ‖
                R1
```

Column 3, line 17, delete the hyphen (-) appearing between "ethylidene malonic".

Column 5, line 40, "a" should read --as--; line 41, "schromium" should read --chromium--.

Column 9, line 2, delete the hyphen (-) appearing between "benzothiazolylidene) dithioacetate--.

Signed and Sealed this

*fifteenth* Day of *June 1976*

[SEAL]

*Attest:*

RUTH C. MASON
*Attesting Officer*

C. MARSHALL DANN
*Commissioner of Patents and Trademarks*